United States Patent
Feng (10) Patent No.: US 9,748,944 B2
(45) Date of Patent: Aug. 29, 2017

(54) TRANSISTOR DEVICE, RELATED METHOD, AND RELATED ELECTRONIC DEVICE

(71) Applicant: Semiconductor Manufacturing International (Shanghai) Corporation, Shanghai (CN)

(72) Inventor: Junhong Feng, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/962,523

(22) Filed: Dec. 8, 2015

(65) Prior Publication Data

US 2016/0191038 A1 Jun. 30, 2016

(30) Foreign Application Priority Data

Dec. 25, 2014 (CN) .......................... 2014 1 0841394

(51) Int. Cl.
  *H03B 1/00* (2006.01)
  *H03K 3/00* (2006.01)
  *H03K 17/14* (2006.01)
  *H03K 17/16* (2006.01)
(52) U.S. Cl.
  CPC ......... *H03K 17/145* (2013.01); *H03K 17/161* (2013.01)
(58) Field of Classification Search
  USPC ................................. 327/108–112
  See application file for complete search history.

(56) References Cited

U.S. PATENT DOCUMENTS

| 8,766,692 | B1* | 7/2014 | Durbha | H03K 3/2893 327/205 |
| 8,773,210 | B2* | 7/2014 | Sinha | H03K 4/501 331/111 |
| 9,589,646 | B2* | 3/2017 | Chen | G11C 16/10 |
| 2015/0145564 | A1* | 5/2015 | Gailhard | H03K 3/012 327/109 |
| 2016/0020765 | A1* | 1/2016 | Hata | H03K 17/18 327/109 |
| 2016/0036418 | A1* | 2/2016 | Yoshizawa | H03K 3/013 327/108 |
| 2016/0191038 | A1* | 6/2016 | Feng | H03K 17/161 327/109 |

OTHER PUBLICATIONS

Zafar et al., "A Comparative Study of NBTI and PBTI (Charge Trapping) in SiO2/HfO2 Stacks with FUSI, TiN, Re Gates", Symposium on VLSI Technology Digest of Technical Papers, 2006, 3 pages.
Ribes et al., "Review on High-k Dielectrics Reliability Issues", IEEE Transactions on Device and Materials Reliability, vol. 5, No. 1, Mar. 2005, 15 pages.

\* cited by examiner

*Primary Examiner* — Adam Houston
(74) *Attorney, Agent, or Firm* — Innovation Counsel LLP (57) ABSTRACT

A transistor device may include an n-type transistor. The transistor device may further include a first bias voltage unit, which is electrically connected to the n-type transistor and configured to apply a first positive bias voltage to a drain terminal of the n-type transistor when the n-type transistor is in an off state. The transistor device may further include a second bias voltage unit electrically, which is connected to the n-type transistor and configured to apply a second positive bias voltage to a source terminal of the n-type transistor when the n-type transistor is in the off state.

19 Claims, 4 Drawing Sheets

TRANSISTOR DEVICE, RELATED METHOD, AND RELATED ELECTRONIC DEVICE

CROSS-REFERENCE TO RELATED APPLICATION

This application claims priority to and benefit of Chinese Patent Application No. 201410841394.3, filed on 25 Dec. 2014; the Chinese Patent Application is incorporated herein by reference in its entirety.

BACKGROUND OF THE INVENTION

The present invention is related to a transistor device, a method of operating the transistor device, and an electronic device that includes the transistor device.

A transistor device may be included in an electronic device and may be configured to, for example, switch and/or amplify electronic signals. When a transistor device has operated for a substantially long time period, elevated temperature may cause undesirable change to a threshold voltage of the transistor device. For example, the transistor device may be/include an n-channel/type metal-oxide-semiconductor field-effect transistor (NMOS transistor), and associated positive bias temperature instability (PBTI) effects may significantly affect the performance of the transistor. The undesirable change to the threshold voltage may serious if the NMOS transistor includes a high-k gate dielectric layer. As a result, the reliability and/or quality of the transistor device and/or the associated electronic device may be unsatisfactory.

SUMMARY

An embodiment of the present invention may be related to a transistor device. The transistor device may include an n-type transistor, e.g., an n-type metal-oxide-semiconductor field-effect transistor (NMOS transistor). The transistor device may further include a first bias voltage unit, which may be electrically connected to the n-type transistor and configured to apply a first positive bias voltage to a drain terminal of the n-type transistor when (and/or if) the n-type transistor is in an off state/mode (or non-conducting state/mode). The transistor device may further include a second bias voltage unit, which may be electrically connected to the n-type transistor and configured to apply a second positive bias voltage to a source terminal of the n-type transistor when (and/or if) the n-type transistor is in the off state.

Each of the first bias voltage unit and the second bias voltage unit may be configured to apply no positive bias voltage to either of the drain terminal of the n-type transistor and the source terminal of the n-type transistor when (and/or if) the n-type transistor is in an on state/mode (or conducting state/mode).

The first positive bias voltage and the second positive bias voltage may effectively enable the n-type transistor to substantially recover from threshold voltage change that may have been caused by temperature change. Therefore, the performance of the n-type transistor may be satisfactory for a substantially long time period. Since the first positive bias voltage and the second positive bias voltage are applied when the n-type transistor is in the off state, e.g., during off periods (or non-conducting periods) of the n-type transistor, there may be no significant interruption in the operation of the n-type transistor, and the n-type transistor may operate normally and effectively.

The first bias voltage unit and the second bias voltage unit may be configured to automatically apply the first positive bias voltage and the second positive bias voltage to the n-type transistor when (and/or if) the n-type transistor is in the off state.

A value of the first positive bias voltage may be equal to a value of the second positive bias voltage.

The first bias voltage unit may include a first p-type transistor and a first inverter. The first p-type transistor may be, for example, a p-type metal-oxide-semiconductor field-effect transistor (PMOS transistor). A gate terminal of the first p-type transistor and a gate terminal of the n-type transistor may be at a same voltage level. A drain terminal of the first p-type transistor may be electrically connected through an input terminal of the first inverter to an output terminal of the first inverter. The input terminal of the first inverter may be electrically connected through the output terminal of the first inverter to the drain terminal of the n-type transistor. A source terminal of the first p-type transistor may be electrically connected through the drain terminal of the first p-type transistor to the input terminal of the first inverter.

The first bias voltage unit may include a first resistor. The output terminal of the first inverter may be electrically connected through the first resistor to the drain terminal of the n-type transistor.

The second bias voltage unit may include a second p-type transistor and a second inverter. The second p-type transistor may be, for example, a PMOS transistor. A gate terminal of the second p-type transistor, the gate terminal of the first p-type transistor, and the gate terminal of the n-type transistor may be at the same voltage level. A drain terminal of the second p-type transistor may be electrically connected through an input terminal of the second inverter to an output terminal of the second inverter. The input terminal of the second inverter may be electrically connected through the output terminal of the second inverter to the source terminal of the n-type transistor. A source terminal of the second p-type transistor may be electrically connected through the drain terminal of the second p-type transistor to the input terminal of the second inverter.

The first bias voltage unit may include a first resistor. The output terminal of the first inverter may be electrically connected through the first resistor to the drain terminal of the n-type transistor. The second bias voltage unit may include a second resistor. The output terminal of the second inverter may be electrically connected through the second resistor to the source terminal of the n-type transistor.

A resistance value of the first resistor may be equal to a resistance value of the second resistor.

The first resistor may be a first variable resistor that has a resistance value range of 1E3 to 1E8 ohms. The second resistor may be a second variable resistor that has a resistance value range of 1E3 to 1E8.

The source terminal of the first p-type transistor may receive a first applied voltage, which may be a first negative power supply voltage. The source terminal of the second p-type transistor may receive a second applied voltage, which may be a second negative power supply voltage. A value of the first applied voltage may be equal to a value of the second applied voltage.

The gate terminal of the n-type transistor may receive a first copy of a signal. The signal may have alternating values. For example, the signal may have a positive voltage value during high-value periods and may have a reference voltage value (or ground voltage value) lower than the positive voltage value during low-value periods, wherein each low-value period may immediately follow one high-value period and/or may immediately precede one high-value period. The gate terminal of the first p-type transistor may receive a second copy of the signal. The gate terminal of the second p-type transistor may receive a third copy of the signal.

The n-type transistor may be positioned at a core region of an integrated circuit that includes the transistor device. The first p-type transistor may be positioned at an input/output region of the integrated circuit. The second p-type transistor may be positioned at the input/output region of the integrated circuit. The core region may be a center portion of the integrated circuit. The input/output region may be a perimeter portion of the integrated circuit.

An embodiment of the present invention may be related to a method of operating a transistor device. The transistor device may include an n-type transistor. The method may include the following steps: applying a first positive bias voltage to a drain terminal of the n-type transistor when (and/or if) the n-type transistor is in an off state; and applying a second positive bias voltage to a source terminal of the n-type transistor when (and/or if) the n-type transistor is in the off state.

The method may include applying no positive bias voltage to either of the drain terminal of the n-type transistor and the source terminal of the n-type transistor when (and/or if) the n-type transistor is in an on state.

A value of the first positive bias voltage may be equal to a value of the second positive bias voltage.

The method may include the following steps: inverting, using a first inverter, a first applied voltage to generate the first positive bias voltage; and inverting, using a second inverter, a second applied voltage to generate the second positive bias voltage.

The method may include the following steps: using a first resistor to minimize current leakage at the drain terminal of the n-type transistor; and using a second resistor to minimize current leakage at the source terminal of the n-type transistor. The first resistor may be electrically connected between a first inverter and the drain terminal of the n-type transistor. The second resistor may be electrically connected between a second inverter and the source terminal of the n-type transistor.

The method may include the following steps: providing a first copy of a signal to a gate terminal of the n-type transistor; providing a second copy of the signal to a gate terminal of a first p-type transistor of the transistor device; and providing a third copy of the signal to a gate terminal of a second p-type transistor of the transistor device.

An embodiment of the present invention may be related to an electronic device. The electronic device may include an electronic component and a transistor device. The transistor device may be electrically connected to the electronic component. The transistor device may have one or more of the aforementioned features.

According to embodiments of the present invention, during off periods (or non-conducting periods) of an n-type transistor (e.g., an NMOS transistor), positive bias voltages may be applied to the n-type transistor for enabling the threshold voltage of the n-type transistor to substantially recover from temperature-related changes, wherein the off periods of the n-type transistor may be between on periods (or conducting periods) of the n-type transistor. Therefore, the n-type transistor may operate normally and satisfactorily for a substantially long time period. Advantageously, the reliability and/or quality of the n-type transistor, the associated transistor device, and/or the associated electronic device may be satisfactory.

According to embodiments of the present invention, the positive bias voltages may be applied during off periods of an n-type transistor, but not during on periods of the n-type transistor. Therefore, the positive bias voltages may not significantly interfere with operation of the n-type transistor.

The above summary is related to some of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "below," "lower," "under," "above," "upper" and the like, may be used herein for ease of description to describe the relationship of one element or feature to another element(s) or feature(s) as illustrated in the figures. The spatially relative terms may encompass different orientations of a device or structure in use or operation, in addition to the orientation(s) illustrated in the figures. For example, if a device or structure illustrated in a figure is turned over, elements described as "below" or "beneath" relative to other elements would then be positioned "above" relative to the other elements or features. Thus, the term "below" can encompass both a position of above and below. A device or structure may be otherwise oriented (e.g., rotated by 90 degrees or oriented at other orientations), and the spatially relative descriptors should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 1:
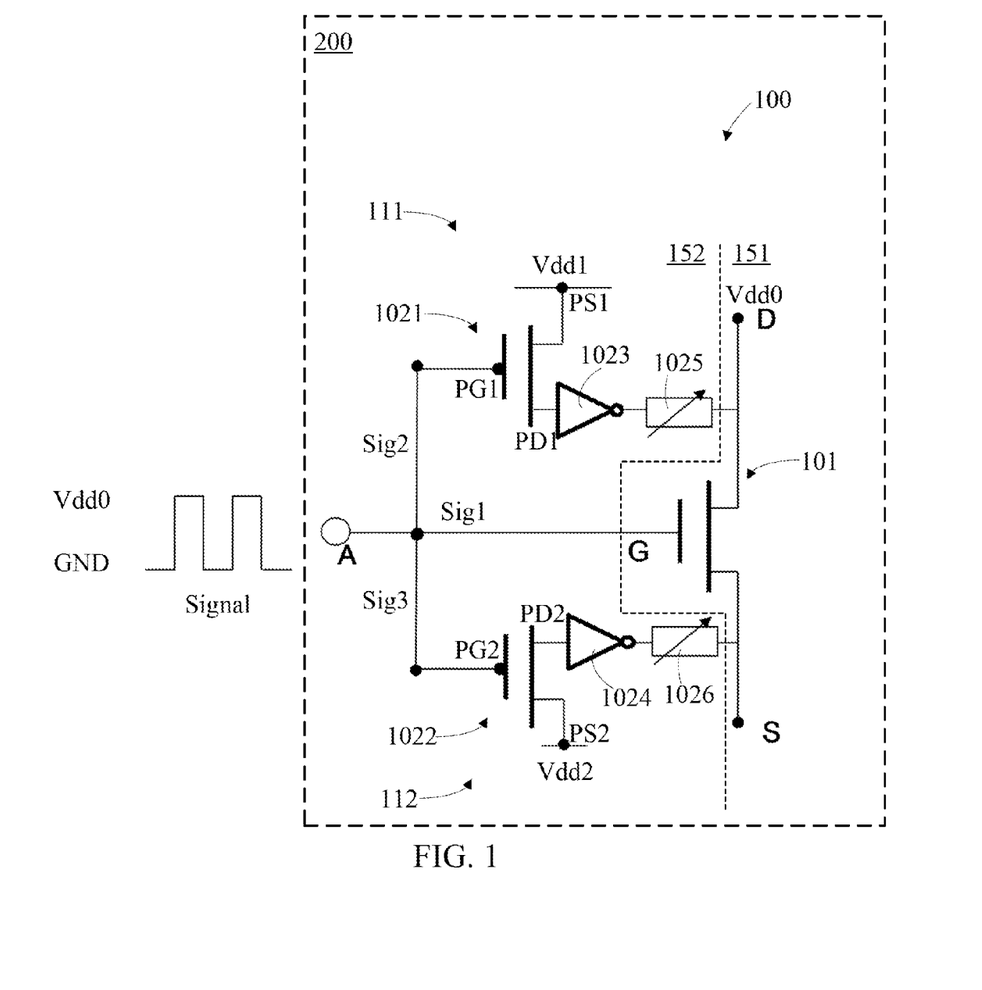
FIG. 1 shows a schematic diagram (e.g., a schematic circuit diagram) that illustrates elements, structures, and/or operation of a transistor device in accordance with one or more embodiments of the present invention.

FIG. 1 shows a schematic diagram (e.g., a schematic circuit diagram) that illustrates elements, structures, and/or operation of a transistor device 100 in accordance with one or more embodiments of the present invention. The transistor device 100 may include an n-type transistor 101, e.g., an n-type metal-oxide-semiconductor field-effect transistor (NMOS transistor). The transistor device 100 may further include a first bias voltage unit 111, which may be electrically connected to the n-type transistor 101 and configured to apply a first positive bias voltage to a drain terminal D of the n-type transistor 101 when (and/or if) the n-type transistor 101 is in an off state. The transistor device 100 may further include a second bias voltage unit 112, which may be electrically connected to the n-type transistor 101 and configured to apply a second positive bias voltage to a source terminal S of the n-type transistor 101 when (and/or if) the n-type transistor 101 is in the off state.

The first bias voltage unit 111 and the second bias voltage unit 112 may be configured to automatically apply the first positive bias voltage and the second positive bias voltage when (and/or if) the n-type transistor 101 is in the off state. A value of the first positive bias voltage may be equal to a value of the second positive bias voltage.

Each of the first bias voltage unit 111 and the second bias voltage unit 112 may be configured to apply no positive bias voltage to either of the drain terminal D of the n-type transistor 101 and the source terminal S of the n-type transistor 101 when (and/or if) the n-type transistor 101 is in an on state.

The first positive bias voltage and the second positive bias voltage may effectively enable the n-type transistor 101 to substantially recover from threshold voltage change that may have been caused by temperature change. Therefore, the performance of the n-type transistor 101 may be satisfactory for a substantially long time period. Since the first positive bias voltage and the second positive bias voltage are applied when the n-type transistor 101 is in the off state, e.g., during off periods (or non-conducting periods) of the n-type transistor 101, there may be no significant interruption in the operation of the n-type transistor 101, and the n-type transistor 101 may operate normally and effectively.

The first bias voltage unit 111 may include a first p-type transistor 1021 and a first inverter 1023. The first p-type transistor 1021 may be, for example, a p-type metal-oxide-semiconductor field-effect transistor (PMOS transistor). A gate terminal PG1 of the first p-type transistor 1021 and a gate terminal G of the n-type transistor 101 may be at a same voltage level. A drain terminal PD1 of the first p-type transistor 1021 may be electrically connected through an input terminal of the first inverter 1023 to an output terminal of the first inverter 1023. The input terminal of the first inverter 1023 may be electrically connected through the output terminal of the first inverter 1023 to the drain terminal D of the n-type transistor 101. A source terminal PS1 of the first p-type transistor 1021 may be electrically connected through the drain terminal PD1 of the first p-type transistor 1021 to the input terminal of the first inverter 1023.

The first bias voltage unit 111 may include a first resistor 1025. The output terminal of the first inverter 1023 may be electrically connected through the first resistor 1025 to the drain terminal D of the n-type transistor 101.

The second bias voltage unit 112 may include a second p-type transistor 1022 and a second inverter 1024. The second p-type transistor 1022 may be, for example, a PMOS transistor. A gate terminal PG2 of the second p-type transistor 1022, the gate terminal PG1 of the first p-type transistor 1021, and the gate terminal G of the n-type transistor 101 may be at the same voltage level. A drain terminal PD2 of the second p-type transistor 1022 may be electrically connected through an input terminal of the second inverter 1024 to an output terminal of the second inverter 1024. The input terminal of the second inverter 1024 may be electrically connected through the output terminal of the second inverter 1024 to the source terminal S of the n-type transistor 101. A source terminal PS2 of the second p-type transistor 1022 may be electrically connected through the drain terminal PD2 of the second p-type transistor 1022 to the input terminal of the second inverter 1024.

The second bias voltage unit 112 may include a second resistor 1026. The output terminal of the second inverter 1024 may be electrically connected through the second resistor 1026 to the source terminal S of the n-type transistor 101.

A resistance value of the first resistor 1025 may be equal to a resistance value of the second resistor 1026. The first resistor 1025 may be a first variable resistor that has a resistance value range of 1E3 to 1E8 ohms. The second resistor 1026 may be a second variable resistor that has a resistance value range of 1E3 to 1E8.

The source terminal PS1 of the first p-type transistor 1021 may receive a first applied voltage Vdd1, which may be a first negative power supply voltage, e.g., having a value of −1.8 Volts. The source terminal PS2 of the second p-type transistor 1022 may receive a second applied voltage Vdd2, which may be a second negative power supply voltage, e.g., having a value of −1.8 Volts. A value of the first applied voltage Vdd1 may be equal to a value of the second applied voltage Vdd2.

The gate terminal G of the n-type transistor 101 may receive a first copy Sig1 of a signal, e.g., an input signal for the n-type transistor 101. The signal may be provided through a terminal A of the transistor device 100 and may have alternating values. For example, the signal may have a high (and/or positive) voltage value Vdd0 (e.g., 1.2 Volts) during high-value periods and may have a reference voltage value GND (or ground voltage value GND) lower than the high voltage value Vdd0 during low-value periods. Each low-value period may immediately follow one high-value period and/or may immediately precede one high-value period. The gate terminal PG1 of the first p-type transistor 1021 may receive a second copy Sig2 of the signal. The gate terminal PG2 of the second p-type transistor 1022 may receive a third copy Sig3 of the signal. The drain terminal D of the n-type transistor 101 may receive a voltage having the positive voltage value Vdd0.

The n-type transistor 101 may be an enhancement-mode NMOS transistor, which may be more significantly affected by temperature change than a depletion mode NMOS transistor. The positive bias voltages applied to the gate terminal G of the enhancement-mode NMOS transistor may effectively enable the threshold voltage associated with the enhancement-mode NMOS transistor to substantially recover from temperature-related change, such that the performance and reliability of the enhancement-mode NMOS transistor may be satisfactory. The positive bias voltages may be applied when the enhancement-mode NMOS transistor is in the off state without interfering with the operation of the enhancement-mode NMOS transistor.

The n-type transistor 101 may be positioned at a core region 151 of an integrated circuit 200 that includes the transistor device 100. The core region 151 may be a center portion of the integrated circuit 200. The integration density at the core region 151 may be substantially high. The n-type transistor 101 may have a high-k metal and gate stack structure that includes a high-k dielectric layer. The high-k metal and gate stack structure facilitate the substantially high integration density. The positive bias voltages applied to the gate terminal G of the n-type transistor 101 may effectively enable the threshold voltage associated with the high-k metal and gate stack structure to substantially recover from temperature-related change, such that the performance and reliability of the n-type transistor 101 may be satisfactory. The positive bias voltages may be applied when the n-type transistor 101 is in the off state without interfering with the operation of the n-type transistor 101.

The first p-type transistor 1021 may be positioned at an input/output region 152 of the integrated circuit 200. The second p-type transistor 1022 may be positioned at the input/output region 152 of the integrated circuit 200. The input/output region 152 may be a perimeter portion of the integrated circuit 200. The integration density of the input/output region 152 may be lower than the integration density of the core region 151. The first p-type transistor 1021 and/or the second p-type transistor 1022 may have a larger size than the n-type transistor, may not require a high-k and metal gate stack structure, and may be implemented with a relative low-cost structure. Therefore, cost associated with the transistor device 100 may be minimized.

The transistor device 100 and/or the integrated circuit 200 may be included in an open-drain device.

Figure 2:
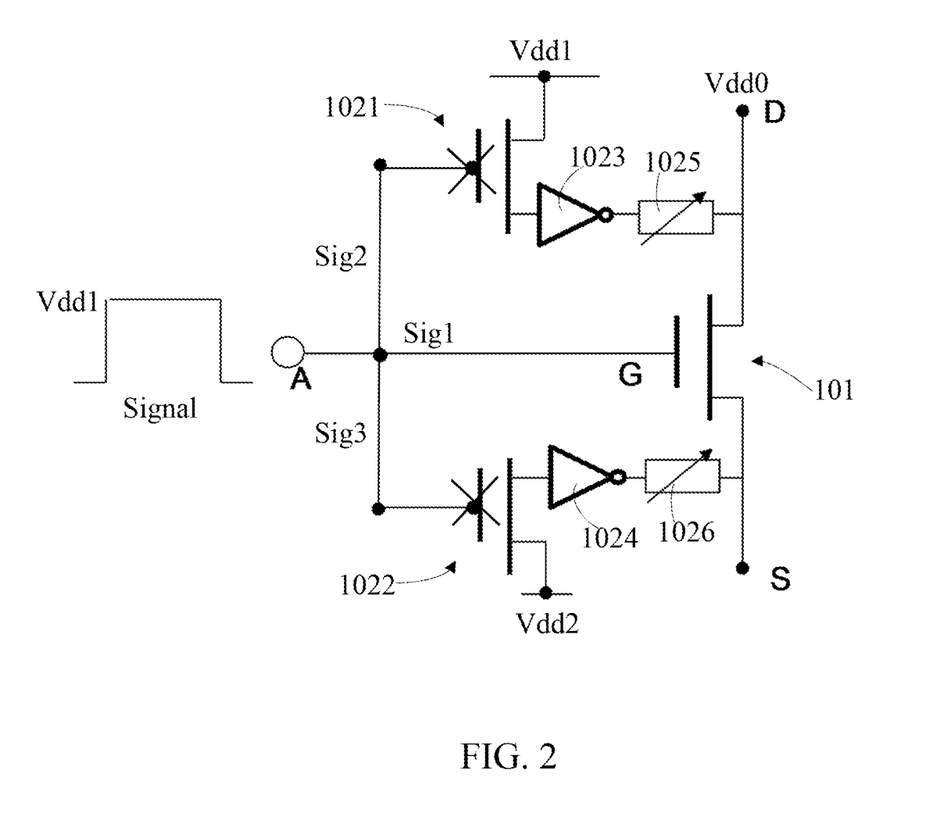
FIG. 2 shows a schematic diagram (e.g., a schematic circuit diagram) that illustrates elements, structures, and/or operation of a transistor device in accordance with one or more embodiments of the present invention.

FIG. 2 shows a schematic diagram (e.g., a schematic circuit diagram) that illustrates elements, structures, and/or operation of the transistor device 100 in accordance with one or more embodiments of the present invention. When the signal received at the terminal A has the high voltage value Vdd0 (e.g., 1.2 Volts), the value of each of the signal copies Sig1, Sig2, and Sig3 may be the high voltage value Vdd0. Therefore, the n-type transistor 101 may be in an on state (or conducting state), and each of the first p-type transistor 1021 and the second p-type transistor 1022 may be in an off state (or non-conducting state) without applying any positive bias voltage to either of the drain terminal D of the n-type transistor 101 and the source terminal S of the n-type transistor 101. The n-type transistor 101 may transmit a voltage signal (e.g., having the value Vdd0) normally. Since the p-type transistors 1021 and 1022 are off when the n-type transistor 101 is on, the bias voltage units 111 and 112 may not significantly interfere with operation of the n-type transistor 101.

Figure 3:
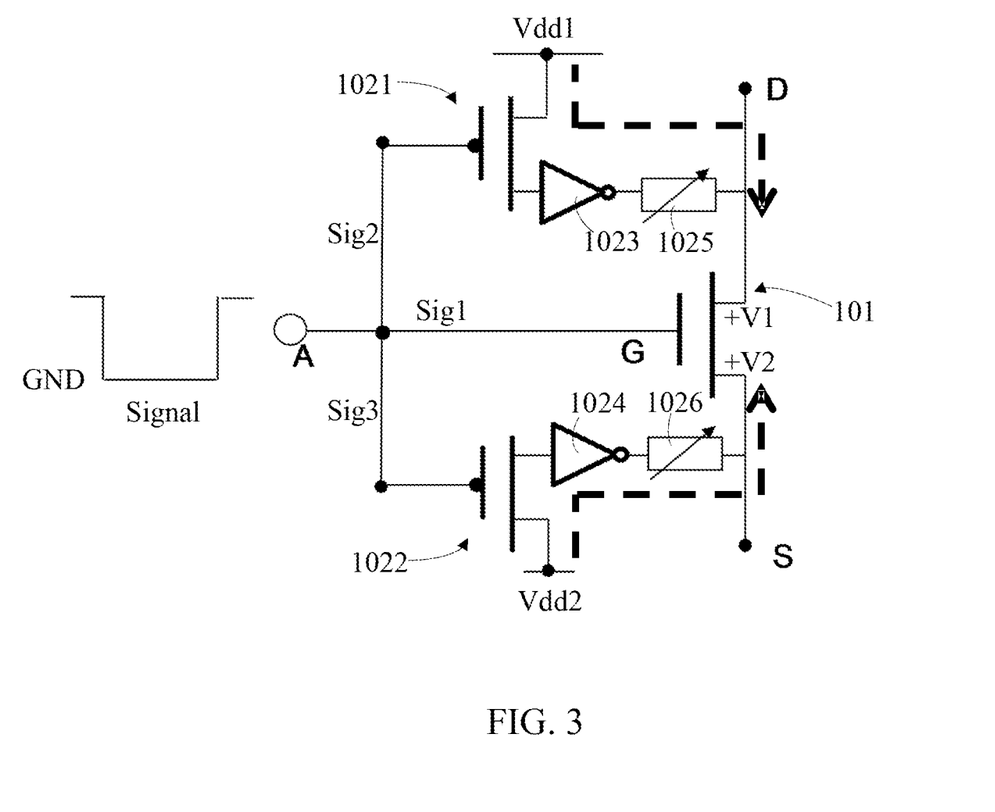
FIG. 3 shows a schematic diagram (e.g., a schematic circuit diagram) that illustrates elements, structures, and/or operation of a transistor device in accordance with one or more embodiments of the present invention.

FIG. 3 shows a schematic diagram (e.g., a schematic circuit diagram) that illustrates elements, structures, and/or operation of the transistor device 100 in accordance with one or more embodiments of the present invention. When the signal received at the terminal A has the reference voltage value GND (or ground voltage value GND), the value of each of the signal copies Sig1, Sig2, and Sig3 may be the reference voltage value GND. Therefore, the n-type transistor 101 may be in an off state (or non-conducting state), and each of the first p-type transistor 1021 and the second p-type transistor may be in an on state (or conducting state) to automatically transmit the first applied voltage Vdd1 (e.g. having a value of −1.8 Volts) and the second applied voltage Vdd2 (e.g. having a value of −1.8 Volts) to the first inverter 1023 and the second inverter 1024, respectively.

The first inverter 1023 may automatically invert the first applied voltage Vdd1 to generate the first positive bias voltage +V1 (e.g. having a value of +1.8 Volts). The second inverter 1024 may automatically invert the second applied voltage Vdd2 to generate the second positive bias voltage +V2 (e.g. having a value of +1.8 Volts).

The first resistor 1025 may automatically transmit the first positive bias voltage +V1 to the drain terminal D of the n-type transistor 101 and may minimize current leakage at the drain terminal D of the n-type transistor 101. The second resistor 1026 may automatically transmit the second positive bias voltage +V2 to the source terminal S of the n-type transistor 101 and may minimize current leakage at the source terminal S of the n-type transistor 101.

The first positive bias voltage +V1 and the second positive bias voltage +V2 may have equal values such that the n-type transistor 101 may remain in the off state. The first positive bias voltage +V1 and the second positive bias voltage +V2 may effectively enable the n-type transistor 101 to significantly recover from threshold voltage change that may have been caused by temperature change. Advantageously, the performance of the n-type transistor 101 may be satisfactory in one or more subsequent on periods, when the n-type transistor 101 is in the on state for transmitting a voltage signal.

According to the signal received at the terminal A, the n-type transistor 101 may be in the on-and-transmission state and in the off-and-recovery state alternately. Given the recovery in the off-and-recovery state in the off periods, performance of the n-type transistor 101 may be satisfactory in the on-and-transmission state in the on periods. Overall, performance of the n-type transistor 101 may be substantially consistent and satisfactory for a substantially long time period.

The positive bias voltages +V1 and +V2 may be applied during off periods of the n-type transistor, but not during on periods of the n-type transistor 101. Therefore, the positive bias voltages may not significantly interfere with operation of the n-type transistor 101.

Figure 4:
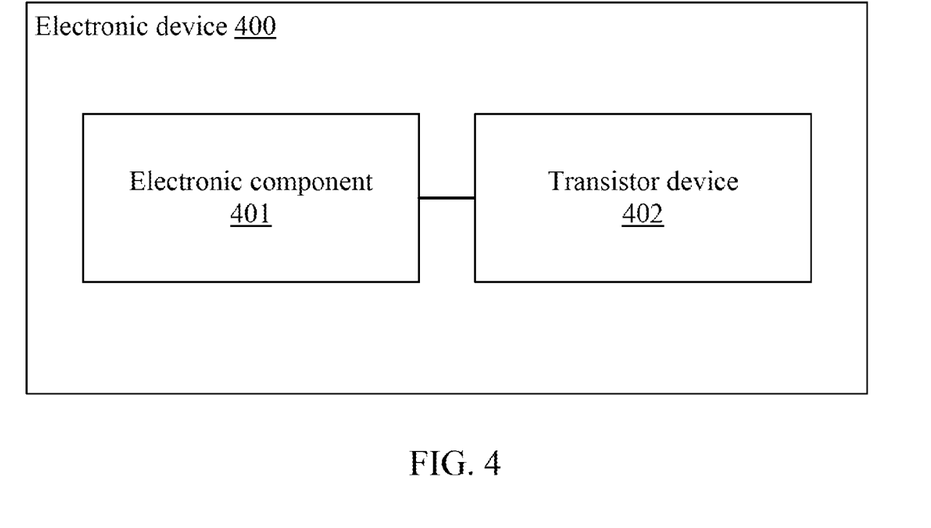
FIG. 4 shows a schematic block diagram that illustrates elements in an electronic device in accordance with one or more embodiments of the present invention.

FIG. 4 shows a schematic block diagram that illustrates elements in an electronic device 400 in accordance with one or more embodiments of the present invention. The electronic device 400 may include an electronic component 401 and a transistor device 402 that is electrically connected to the electronic component 401. The transistor device 402 may have one or more of the above-discussed features.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the present invention, during off periods (or non-conducting periods) of an n-type transistor (e.g., an NMOS transistor), positive bias voltages may be automatically applied to the n-type transistor for enabling the threshold voltage of the n-type transistor to substantially recover from temperature-related changes, wherein the off periods of the n-type transistor may be between on periods (or conducting periods) of the n-type transistor. Therefore, the n-type transistor may operate normally and satisfactorily for a substantially long time period. Advantageously, the reliability and/or quality of the n-type transistor, the associated transistor device, and/or the associated electronic device may be satisfactory.

According to embodiments of the present invention, the positive bias voltages may be applied during off periods of an n-type transistor, but not during on periods of the n-type transistor. Therefore, the positive bias voltages may not significantly interfere with operation of the n-type transistor.

While this invention has been described in terms of several embodiments, there are alterations, permutations, and equivalents, which fall within the scope of this invention. There are many alternative ways of implementing the methods and apparatuses of the present invention. Embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A transistor device comprising:
an n-type transistor;
a first bias voltage unit, which is electrically connected to the n-type transistor and configured to apply a first positive bias voltage to a drain terminal of the n-type transistor when the n-type transistor is in an off state, wherein the first bias voltage unit comprises a first p-type transistor and a first inverter; and
a second bias voltage unit, which is electrically connected to the n-type transistor and configured to apply a second positive bias voltage to a source terminal of the n-type transistor when the n-type transistor is in the off state.

2. The transistor device of claim 1, wherein each of the first bias voltage unit and the second bias voltage unit is configured to apply no positive bias voltage to either of the drain terminal of the n-type transistor and the source terminal of the n-type transistor when the n-type transistor is in an on state.

3. The transistor device of claim 1, wherein the first bias voltage unit and the second bias voltage unit are configured to automatically apply the first positive bias voltage and the second positive bias voltage to the n-type transistor when the n-type transistor is in the off state.

4. The transistor device of claim 1,
wherein a gate terminal of the first p-type transistor and a gate terminal of the n-type transistor are at a same voltage level, and
wherein a drain terminal of the first p-type transistor is electrically connected through an input terminal of the first inverter to an output terminal of the first inverter, and wherein the input terminal of the first inverter is electrically connected through the output terminal of the first inverter to the drain terminal of the n-type transistor.

5. The transistor device of claim 4, wherein the first bias voltage unit further comprises a first resistor, and wherein the output terminal of the first inverter is electrically connected through the first resistor to the drain terminal of the n-type transistor.

6. The transistor device of claim 4, wherein the second bias voltage unit comprises:
a second p-type transistor, wherein a gate terminal of the second p-type transistor, the gate terminal of the first p-type transistor, and the gate terminal of the n-type transistor are at the same voltage level; and
a second inverter, wherein a drain terminal of the second p-type transistor is electrically connected through an input terminal of the second inverter to an output terminal of the second inverter, and wherein the input terminal of the second inverter is electrically connected through the output terminal of the second inverter to the source terminal of the n-type transistor.

7. The transistor device of claim 6, wherein the first bias voltage unit further comprises a first resistor, wherein the output terminal of the first inverter is electrically connected through the first resistor to the drain terminal of the n-type transistor, wherein the second bias voltage unit further comprises a second resistor, wherein the output terminal of the second inverter is electrically connected through the second resistor to the source terminal of the n-type transistor.

8. The transistor device of claim 7, wherein a resistance value of the first resistor is equal to a resistance value of the second resistor.

9. The transistor device of claim 7, wherein the first resistor is a first variable resistor that has a resistance value range of 1E3 to 1E8 ohms, and wherein the second resistor is a second variable resistor that has a resistance value range of 1E3 to 1E8.

10. The transistor device of claim 6, wherein a source terminal of the first p-type transistor receives a first applied voltage, wherein a source terminal of the second p-type transistor receives a second applied voltage, and wherein a value of the first applied voltage is equal to a value of the second applied voltage.

11. The transistor device of claim 6, wherein the gate terminal of the n-type transistor receives a first copy of a signal, wherein the gate terminal of the first p-type transistor receives a second copy of the signal, and wherein the gate terminal of the second p-type transistor receives a third copy of the signal.

12. The transistor device of claim 1, wherein the n-type transistor is positioned at a core region of an integrated circuit that includes the transistor device, and wherein at least one of the p-type transistor of the first bias voltage unit and a p-type transistor of the second bias voltage unit is positioned at an input/output region of the integrated circuit.

13. The transistor device of claim 1, wherein the second bias voltage unit comprises:
a second p-type transistor, wherein a gate terminal of the second p-type transistor, the gate terminal of the first p-type transistor, and the gate terminal of the n-type transistor are at the same voltage level; and
a second inverter, wherein a drain terminal of the second p-type transistor is electrically connected through an input terminal of the second inverter to an output terminal of the second inverter, and wherein the input terminal of the second inverter is electrically connected through the output terminal of the second inverter to the source terminal of the n-type transistor.

14. A method of operating a transistor device, the transistor device comprising an n-type transistor, the method comprising:
applying a first positive bias voltage to a drain terminal of the n-type transistor when the n-type transistor is in an off state;
applying a second positive bias voltage to a source terminal of the n-type transistor when the n-type transistor is in the off state;
inverting, using a first inverter, a first applied voltage to generate the first positive bias voltage; and
inverting, using a second inverter, a second applied voltage to generate the second positive bias voltage.

15. The method of claim 14, comprising: applying no positive bias voltage to either of the drain terminal of the n-type transistor and the source terminal of the n-type transistor when the n-type transistor is in an on state.

16. The method of claim 14, wherein a value of the first positive bias voltage is equal to a value of the second positive bias voltage.

17. The method of claim 14, comprising:
using a first resistor to minimize current leakage at the drain terminal of the n-type transistor, wherein the first resistor is electrically connected between the first inverter and the drain terminal of the n-type transistor; and
using a second resistor to minimize current leakage at the source terminal of the n-type transistor, wherein the second resistor is electrically connected between the second inverter and the source terminal of the n-type transistor.

18. The method of claim 14, comprising:
providing a first copy of a signal to a gate terminal of the n-type transistor;
providing a second copy of the signal to a gate terminal of a first p-type transistor of the transistor device; and
providing a third copy of the signal to a gate terminal of a second p-type transistor of the transistor device,
wherein both the first p-type transistor and the second p-type transistor are in an on state when the n-type transistor is in the off state.

19. An electronic device comprising:
an electronic component; and
a transistor device electrically connected to the electronic component and comprising:
an n-type transistor;
a first bias voltage unit electrically connected to the n-type transistor and configured to apply a first positive bias voltage to a drain terminal of the n-type transistor when the n-type transistor is in an off state, wherein the first bias voltage unit comprises a first p-type transistor and a first inverter; and
a second bias voltage unit electrically connected to the n-type transistor and configured to apply a second positive bias voltage to a source terminal of the n-type transistor when the n-type transistor is in the off state.

* * * * *